United States Patent
Keiper et al.

(10) Patent No.: US 8,067,701 B2
(45) Date of Patent: Nov. 29, 2011

(54) I/O CONNECTORS WITH EXTENDABLE FARADAY CAGE

(75) Inventors: Steven Keiper, Cupertino, CA (US); John Brock, Cupertino, CA (US); Eugene Kim, Cupertino, CA (US); John Schen, Cupertino, CA (US); Steve Cabral, Cupertino, CA (US); Dave Hardell, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 157 days.

(21) Appl. No.: 12/202,038

(22) Filed: Aug. 29, 2008

(65) Prior Publication Data

US 2009/0173534 A1    Jul. 9, 2009

Related U.S. Application Data

(60) Provisional application No. 61/019,540, filed on Jan. 7, 2008.

(51) Int. Cl.
  *H05K 9/00* (2006.01)
(52) U.S. Cl. ...... 174/356; 174/375; 174/380; 361/679.4
(58) Field of Classification Search ............... 174/356, 174/357, 358, 377, 380, 385; 361/816, 818, 361/679.4
See application file for complete search history.

(56) References Cited

U.S. PATENT DOCUMENTS

| | | | |
|---|---|---|---|
| 3,060,790 A * | 10/1962 | Ward | |
| 3,754,209 A * | 8/1973 | Molloy et al. | |
| 4,814,552 A * | 3/1989 | Stefik et al. | |
| 4,845,311 A | 7/1989 | Schreiber et al. | |
| 4,855,740 A | 8/1989 | Muramatsu et al. | |
| 5,040,479 A | 8/1991 | Thrash | |
| 5,081,482 A | 1/1992 | Miki et al. | |
| 5,245,734 A | 9/1993 | Issartel | |
| 5,317,105 A * | 5/1994 | Weber | 174/355 |
| 5,342,991 A | 8/1994 | Xu et al. | |
| 5,365,461 A * | 11/1994 | Stein et al. | |
| 5,371,901 A | 12/1994 | Reed et al. | |
| 5,583,560 A | 12/1996 | Florin et al. | |
| 5,726,645 A | 3/1998 | Kamon et al. | |
| 5,770,898 A * | 6/1998 | Hannigan et al. | 307/147 |
| 5,815,379 A | 9/1998 | Mundt | |
| 5,831,601 A * | 11/1998 | Vogeley et al. | |
| 5,951,908 A | 9/1999 | Cui et al. | |

(Continued)

FOREIGN PATENT DOCUMENTS

EP    1881513    1/2008

(Continued)

OTHER PUBLICATIONS

Author Unknown, "Electronic Polymers, Semiconducting Polymers and Light Emitting Polymers - Focus of Polythiophene," Azom:com, http://wvvw.azom.com/details.asp?ArticleID=2772, at least as early as Dec. 1, 2005.

(Continued)

*Primary Examiner* — Hung V Ngo
(74) *Attorney, Agent, or Firm* — Dorsey & Whitney LLP (57) ABSTRACT

An apparatus providing one or more I/O connections to a computer. The apparatus includes a Faraday cage generally about a flex cable, or other computing element, that may translate when the I/O ports to the computer are utilized. The embodiment maintains the Faraday cage for the flex cable or element as the I/O port housing opens or closes.

18 Claims, 4 Drawing Sheets

U.S. PATENT DOCUMENTS

| | | | |
|---|---|---|---|
| 5,975,953 A * | 11/1999 | Peterson | 439/607.18 |
| 6,130,822 A | 10/2000 | Della Fiora et al. | |
| 6,180,048 B1 | 1/2001 | Katori | |
| 6,337,678 B1 | 1/2002 | Fish | |
| 6,347,882 B1 * | 2/2002 | Vrudny et al. | |
| 6,525,929 B2 | 2/2003 | Carr | |
| 6,532,446 B1 | 3/2003 | King | |
| 6,611,253 B1 * | 8/2003 | Cohen | |
| 6,713,672 B1 * | 3/2004 | Stickney | 174/382 |
| 6,717,073 B2 * | 4/2004 | Xu et al. | |
| 6,794,992 B1 | 9/2004 | Rogers | |
| 6,834,294 B1 | 12/2004 | Katz | |
| 6,836,651 B2 | 12/2004 | Segal et al. | |
| 6,914,551 B2 | 7/2005 | Vidal | |
| 6,995,752 B2 | 2/2006 | Lu | |
| 6,998,594 B2 * | 2/2006 | Gaines et al. | |
| 7,088,261 B2 * | 8/2006 | Sharp et al. | |
| 7,133,030 B2 | 11/2006 | Bathiche | |
| 7,167,083 B2 | 1/2007 | Giles | |
| 7,196,273 B2 * | 3/2007 | Tanaka et al. | |
| 7,211,734 B2 | 5/2007 | Bracaleone | |
| 7,274,303 B2 | 9/2007 | Dresti et al. | |
| 7,315,908 B2 | 1/2008 | Anderson | |
| 7,347,712 B2 | 3/2008 | O'Connell et al. | |
| 7,417,624 B2 * | 8/2008 | Duff | |
| 7,446,303 B2 * | 11/2008 | Maniam et al. | |
| 7,453,441 B1 * | 11/2008 | Iorfida et al. | |
| 7,489,308 B2 * | 2/2009 | Blake et al. | |
| 7,557,690 B2 * | 7/2009 | McMahon | |
| 7,598,686 B2 | 10/2009 | Lys et al. | |
| 7,634,263 B2 | 12/2009 | Louch et al. | |
| 7,646,379 B1 * | 1/2010 | Drennan et al. | |
| 7,683,263 B2 | 3/2010 | Chiang | |
| 7,710,397 B2 | 5/2010 | Krah et al. | |
| 2003/0174072 A1 | 9/2003 | Salomon | |
| 2003/0210221 A1 * | 11/2003 | Aleksic | |
| 2004/0118582 A1 * | 6/2004 | Deguchi | 174/35 GC |
| 2004/0230912 A1 | 11/2004 | Clow et al. | |
| 2004/0238195 A1 * | 12/2004 | Thompson | 174/35 GC |
| 2005/0110777 A1 * | 5/2005 | Geaghan et al. | |
| 2005/0162411 A1 * | 7/2005 | Berkel van | |
| 2005/0200286 A1 | 9/2005 | Stoschek et al. | |
| 2006/0042820 A1 | 3/2006 | Lin et al. | |
| 2006/0103081 A1 * | 5/2006 | Dietrich et al. | 277/653 |
| 2007/0050054 A1 | 3/2007 | Sambandam Guruparan et al. | |
| 2007/0124772 A1 | 5/2007 | Bennett et al. | |
| 2007/0174058 A1 | 7/2007 | Burns et al. | |
| 2007/0195068 A1 * | 8/2007 | Kable et al. | |
| 2007/0285405 A1 * | 12/2007 | Rehm | |
| 2008/0001787 A1 | 1/2008 | Smith et al. | |
| 2008/0060842 A1 * | 3/2008 | Barringer et al. | 174/354 |
| 2008/0150917 A1 * | 6/2008 | Libbey et al. | |
| 2008/0291620 A1 | 11/2008 | DiFonzo et al. | |
| 2009/0002328 A1 | 1/2009 | Ullrich et al. | |
| 2009/0009489 A1 * | 1/2009 | Lee | |
| 2009/0104898 A1 | 4/2009 | Harris | |
| 2009/0167704 A1 | 7/2009 | Terlizzi et al. | |
| 2009/0173533 A1 | 7/2009 | Brock et al. | |
| 2009/0176391 A1 | 7/2009 | Brock et al. | |
| 2009/0222270 A2 | 9/2009 | Likens et al. | |
| 2009/0277763 A1 | 11/2009 | Kyowski et al. | |
| 2009/0283342 A1 * | 11/2009 | Schediwy et al. | |
| 2010/0044067 A1 | 2/2010 | Wong et al. | |
| 2010/0053468 A1 * | 3/2010 | Harvill | |
| 2010/0081375 A1 | 4/2010 | Rosenblatt et al. | |
| 2010/0214226 A1 * | 8/2010 | Brown et al. | |
| 2010/0300856 A1 | 12/2010 | Pance et al. | |
| 2010/0301755 A1 | 12/2010 | Pance et al. | |
| 2010/0302169 A1 | 12/2010 | Pance et al. | |
| 2010/0306683 A1 | 12/2010 | Pance et al. | |
| 2011/0037734 A1 * | 2/2011 | Pance et al. | |
| 2011/0038114 A1 * | 2/2011 | Pance et al. | |

FOREIGN PATENT DOCUMENTS

| | | |
|---|---|---|
| EP | 2017694 | 1/2009 |
| FR | 2801402 | 5/2001 |
| GB | 2433211 | 6/2007 |
| JP | 58112263 | 7/1983 |
| KR | 2002013984 | 2/2002 |
| KR | 20030035305 | 5/2003 |
| WO | WO 01/069567 | 9/2001 |
| WO | WO 02/073587 | 9/2002 |
| WO | WO2005/065034 | 7/2005 |
| WO | WO2009/059479 | 5/2009 |
| WO | WO 09/136929 | 11/2009 |
| WO | WO 2010/058376 | 5/2010 |

OTHER PUBLICATIONS

Author Unknown, "Long Polymers Light Up LEDs," Physicsweb.org, http://www.physicsweb.org/articles/news/6/4/22/1, at least as early as Apr. 30, 2002.

Author Unknown, "Optimus Keyboard," Art.Lebedev Studio, http://www.artlebedev.com/portfolio/optimus/, at least as early as Dec. 1, 2005.

Author Unknown, "Optimus OLED Keyboard," Gizmodo: The Gadgets Weblog, http://www.gizmodo.com/gadgets/peripherals/input/optimus-oled-keyboard112517.php, at least as early as Dec. 1, 2005.

Author Unknown, "Optimus OLED Keyboard with Customizable Layout," Gear Live, http://www.gearlive.com/index.php/news.article/optimus_oled_keyboard_07131058/, at least as early as Dec. 1, 2005.

Author Unknown, "Optimus Russian Keyboard," Primo Tech, http://www.primotechnology.com/index.php?art+articles/0705/optimus/index.htm, at least as early as Dec. 1, 2005.

Author Unknown, "Organic Light-Emitting Diode," Wikipedia.com, http://en.wikipedia.org/wiki/OLED, at least as early as Dec. 1, 2005.

Author Unknown, "Organic Polymers to Precede Nano Semi," EETimes.com, http://www.eet.com/story/OEG20030923S0055, at least as early as Dec. 1, 2005.

Author Unknown, "Physics News Update," American Institute of Physics, http://www.aip.org/pnu/1993/split/pnu1148-3.htm, Oct. 19, 1993.

Author Unknown, "Polymer Light-Emitting Diodes," Philips Research —Technologies, http://www.research.philips.com/technologies/display/polyled/polyled/, at least as early as Dec. 1, 2005.

Author Unknown, "RedEye mini Plug-in Universal Remote Adapter for iPhone, iPod touch and iPad," Amazon.com, 4 pages, date unknown.

Author Unknown, "Re iPhone Universal Remote Control— Infrared Remote Control Accessory for iPhone and iPod touch," http://www.amazon.com/iPhone-UniversalRemote-Control-Accessory/dp/tech-data/B0038Z4..., 2 pages, at least as early as Jul. 15, 2010.

Author Unknown, "What is OLED (Organic Light Emitting Diode)?," WiseGeek.com, http://www.wisegeek.com/what-is-an-oled.htm?referrer+adwords_campaign=oled_ad=024..., at least as early as Dec. 1, 2005.

Author Unknown, "What is PLED?—A Word Definition from the Webopedia Computer Dictionary," http://www.webopedia.com/TERM/P/PLED/html, at least as early as Dec. 1, 2005.

Braun et al., "Transient Repsonse of Passive Matrix Polymer LED Displays," http://www.ee.calpoly.edu/~dbraun/papers/ICSM2000BraunEricksonK177.html, at least as early as Dec. 1, 2005.

IBM, "Additional Functionality Added to Cell Phone via "Learning" Function Button," www.ip.com, 2 pages, Feb. 21, 2007.

Kwon et al., "Haptic Interferences for Mobile Devices: a Survey of the State of the Art," Telerobotics and Control Laboratory, KAIST (Korea Advanced Institute of Science and Technology, Korea, Dec. 11, 2007.

Motorola TDB et al., "Universal Programmable Remote Control/Telephone," www.ip.com, 2 pages, May 1, 1992.

Rojas, "Optimus Keyboard Trumped by the Display Keyboard?," http://www.engadget.com/2005/07/29/optimus-keyboard-trumped-by-the-display-keyboard!, Jul. 29, 2005.

\* cited by examiner

I/O CONNECTORS WITH EXTENDABLE FARADAY CAGE

CROSS-REFERENCE TO RELATED APPLICATIONS

This application claims priority under 37 C.F.R. §119(e) to U.S. Provisional Patent Application No. 61/019,540, filed on Jan. 7, 2008 and entitled "I/O Connectors with Extendable Faraday Cage," which is incorporated by reference herein as if fully set forth in its entirety. This application is related to 1) U.S. Provisional Patent Application No. 61/019,530, filed Jan. 7, 2008 and entitled "Input/Output Connector and Housing;" 2) U.S. Provisional Patent Application No. 61/019,538, filed Jan. 7, 2008 and entitled "Flexible Data Cable;" 3) U.S. Nonprovisional patent application Ser. No. 12/201,867, filed Aug. 29, 2008 and entitled "Input/Output Connector and Housing"; and 4) U.S. Nonprovisional patent application Ser. No. 12/201,975, filed Aug. 29, 2008 and entitled "Flexible Data Cable"; all of which are incorporated by reference herein as if set forth in their entireties.

This application is also related to 1) U.S. Provisional Patent Application No. 61/019,278, filed Jan. 6, 2008, and entitled "MicroDVI Connector;" 2) U.S. Provisional Patent Application No. 61/019,280, filed Jan. 6, 2008, and entitled "USB Connector and Housing;" 3) U.S. Provisional Patent Application No. 61/010,116, filed Jan. 6, 2008, and entitled "Mag Safe Connector;" 4) U.S. Nonprovisional patent application Ser. No. 12/242,784, filed Sep. 30, 2008, entitled "MicroDVI Connector;" 5) U.S. Nonprovisional patent application Ser. No. 12/242,712, filed Sep. 30, 2008, entitled "Data Port Connector and Housing;" and 6) U.S. Nonprovisional patent application Ser. No. 12/239,662, filed Sep. 26, 2008, now U.S. Pat. No. 7,762,817, entitled "System for Coupling Interfacing Parts."

BACKGROUND

Computing devices ("computers") have become increasingly technically complex since their inception. Computers, even those capable of being carried in a single hand (such as a mobile phone or personal digital assistant), can perform many more functions at much greater speed than the computers of the 1950s and 1960s. Many of these expanded functions rely on interconnecting a computer with an accessory, another computer or other electronic device (collectively, "peripherals"). For example, peripherals may use a variety of standards to connect to a computer, including: universal serial bus (USB); FireWire; serial; digital video interface (DVI); various audio standards; parallel; and so forth. Different peripherals may employ different connectors or connection standards.

Traditionally, input/output ports occupy a fixed, stationary position in a computer. By maintaining a static position for the input/output ports ("I/O ports"), engineering of the computer case is simplified. However, fixed I/O ports may be inconveniently placed. Further, fixed I/O ports often are susceptible to dust and/or debris entering the ports and interfering with their functions.

Further, I/O ports are generally contained within a Faraday cage defined by the case of the computer. The Faraday cage generally prevents electrical noise from outside the cage entering the interior and vice versa. Thus, the computer case (be it the shell of a desktop or laptop computer, the casing of a mobile telephone or PDA, or other case/cage) prevents noise or extraneous signals from exiting the computer via the I/O ports and reaching a peripheral connected to the port(s). Similarly, the computer case may also prevent noise and/or extraneous signals generated by the peripheral, or another electronic device outside the case, from entering the case via the I/O port and internal associated connector cable. Further, the case may prevent or reduce noise generated by the interior I/O cabling or internal systems from exiting the case. In short, the computer case electrically isolates its interior from its exterior.

Because the I/O ports are typically located within the barrier of a Faraday cage, they are stationary; moving ports might break or exit the electrical barrier. I/O ports may be, for example, recessed within the case to place them within the cage. It may be inconvenient to access such recessed ports.

Accordingly, there is a need in the art for an improved I/O port that places the I/O ports outside of the computer case for ease of access while still electrically insulating the computer from external noise and likewise electrically isolating the exterior from internal noise generated by various electrical components and systems of the computer itself.

SUMMARY

One embodiment of the present invention takes the form of an apparatus that may provide one or more I/O connections to a computer. The embodiment includes a Faraday cage generally about a flex cable (or other internal computing element) that may translate and bend when the I/O ports to the computer are utilized. The embodiment maintains the Faraday cage for the flex cable as the I/O port housing opens or closes.

To maintain the Faraday cage for the flex cable, the embodiment may include a gasket located on either side of the cable. The gaskets may electrically connect to a conductive sock that surrounds the flex cable and thus, in turn, electrically connect to the ground plane(s) of the flex cable. This configuration permits the flex cable to move and slide between the gaskets while maintaining the Faraday cage to protect against interference generated by external electrical equipment.

Another embodiment may take the form of an apparatus for electrically shielding an interior element, including: a chassis defining a notch; a first gasket electrically coupled to a first portion of the notch; a second gasket electrically coupled to a second portion of the notch; and a conductive sock placed between the first gasket and the second gasket and electrically coupled to both the first gasket and the second gasket; wherein the chassis, the first gasket, the second gasket and the conductive sock collectively prevent at least some noise from entering or exiting an interior of the chassis.

Still another embodiment may take the form of an apparatus for electrically shielding an interior element of a computer, including: a computer body defining an aperture therein; a first gasket electrically coupled to a first portion of the aperture; a second gasket electrically coupled to a second portion of the aperture and to the first gasket; wherein the computer body, the first gasket, the second gasket and the conductive sock collectively prevent at least some noise from entering or exiting an interior of the computer body.

Yet another embodiment may be a method for electrically shielding an interior element, including the operations of: providing a chassis defining a notch; electrically coupling a first gasket to a first portion of the notch; electrically coupling a second gasket to a second portion of the notch; placing a conductive sock between the first gasket and the second gasket; and electrically coupling the conductive sock to both the first gasket and the second gasket; wherein the chassis, the first gasket, the second gasket and the conductive sock collectively prevent at least some noise from exiting or entering an interior of the chassis.

These and other embodiments, features and alternatives will be apparent to those of ordinary skill in the art upon reading this disclosure and the appended claims.

DETAILED DESCRIPTION

One embodiment of the present invention takes the form of an apparatus that may provide one or more I/O connections to a computer. The embodiment includes a Faraday cage generally about a flex cable that may translate when the I/O ports to the computer are utilized. The embodiment maintains the Faraday cage for the flex cable as the I/O port housing opens or closes.

To maintain the Faraday cage for the flex cable, the embodiment may include a gasket located on either side of the cable. The gaskets may electrically connect to a conductive sock that surrounds the flex cable and thus, in turn, electrically connect to the ground plane(s) of the flex cable. This configuration permits the flex cable to move between the gaskets while maintaining the Faraday cage to protect against interference generated by external electrical equipment.

Generally, a Faraday cage is an enclosure formed by conducting material, contains internal electrical fields, and blocks out external electrical fields. External electrical fields, or noise, can disrupt electrical signals transmitted within a conducting material and may cause the signals to be degraded or canceled. Faraday cages are utilized in cables to prevent the electrical signals being sent through the cable from being interfered with by external noise. A typical example of a Faraday cage in a cable is a coaxial cable. In a coaxial cable, the conducting material on which the electrical signals are sent is surrounded by a hollow, flexible conductor. This outside flexible conductor acts as a Faraday cage to prevent external noise from corrupting the electrical signals being sent through the coaxial cable. In many coaxial cables, the outside conductor is connected to a ground. By connecting the outside conductor of the cable to a ground, external electrical fields that may interfere with the electrical signals being sent on the interior conductor (e.g., signal wire) are collected by the outside conductor and bled to ground to prevent corruption of the interior signal. This also serves to prevent the signal from radiating outside the cable and thereby becoming noise for external electrical components. The theory, construction and purpose of Faraday cages are well known in the art.

Generally, a Faraday cage for a laptop computer (or other computing device) is formed by the computer body or case housing the internal components. The typically metal body surrounding the internal components of the computer provides a shield against external electrical signals, preventing those external signals from interfering with the computer's internal signals. However, in one embodiment of the present invention, such as the one shown in FIG. 2, one or more I/O ports of the computer may be located outside of the computer body 308 at least during use of the ports. Further, because the I/O ports pivot between an open and closed position, constructing a standard Faraday cage running along the exterior of the computer case may be difficult insofar as a segment of the case pivots to expose the I/O ports.

Figure 3A:
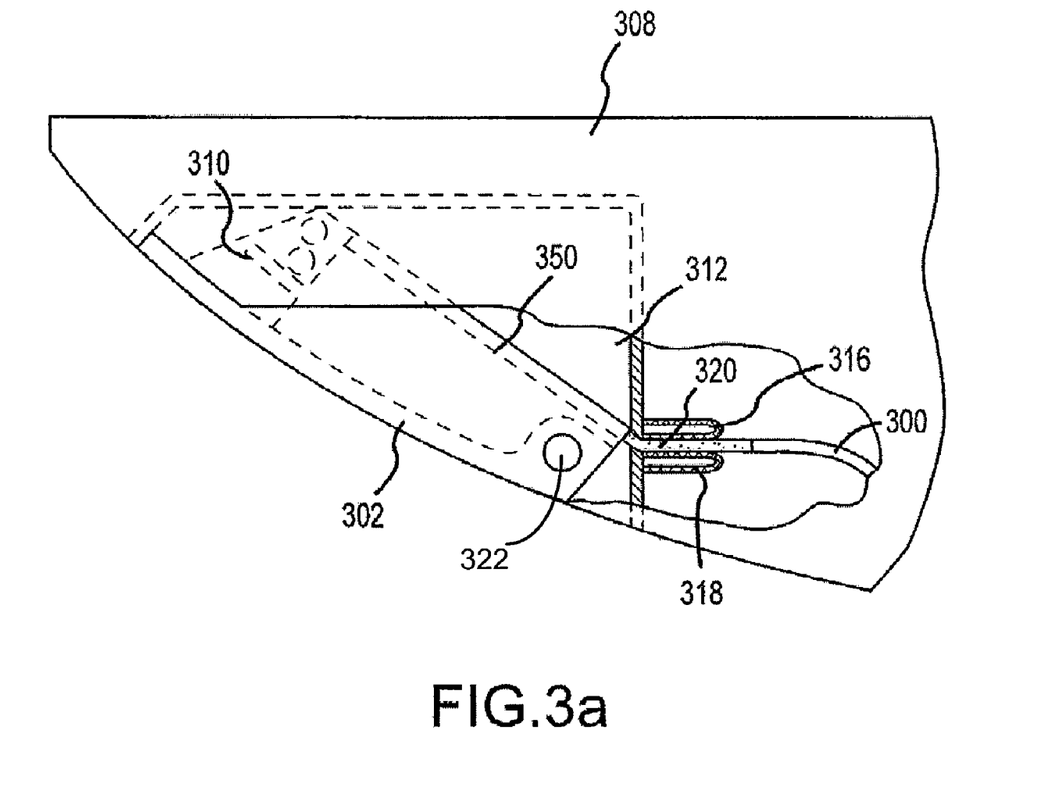
FIG. 3a depicts a cross-sectional view of one embodiment of the present invention with the I/O port housing in the closed position.

The embodiment shown in the cross-sectional view of FIG. 3a likewise includes a Faraday cage, although the boundaries of this cage are not solely those of the exterior of the case 308. Although the case forms the Faraday cage, the cage continues along the top and sidewalls of the "notch" in which the I/O ports rest when the I/O housing is closed. Thus, the Faraday cage formed by the case 308 may be viewed as placing the I/O ports outside the cage. However, the cage surrounds an internal flex cable 300 to prevent external noise from interfering with the electrical signals passing through the cable 300.

In particular, the Faraday cage may be partially composed of the computer body 308, including the top, bottom, and sides of the body. However, the inclusion of the I/O port provides a notch 312 in one side of the computer body 308. To complete the Faraday cage, the cage extends into the notch 312 and past the I/O connectors to a top and bottom gasket 316, 318. Thus, the top, bottom, and sides of the I/O port housing, combined with the top gasket 316, a conductive sock 320 placed about a portion of the flex cable, and the bottom gasket 318 may form the portions of the Faraday cage within the notch 312 of the computer body 308. Generally, the body 308 connects to both the top and bottom gaskets 316, 318. The gaskets are in turn electrically connected to one another by the conductive sock 320. It should be noted that the electrical connection between the sock and gaskets persists regardless of any motion of the I/O housing.

By surrounding at least the majority of the flex cable 300 with these components, the components act as a Faraday cage for the flex cable 300. The component arrangement permits the flex cable 300 to extend between the gaskets 316, 318 and, optionally, move at least slightly as the I/O port housing 302 is opened or closed, without losing the effect of the Faraday cage. The operation of the present invention when the I/O port housing is open is described in further detail in FIG. 4.

Figure 3B:
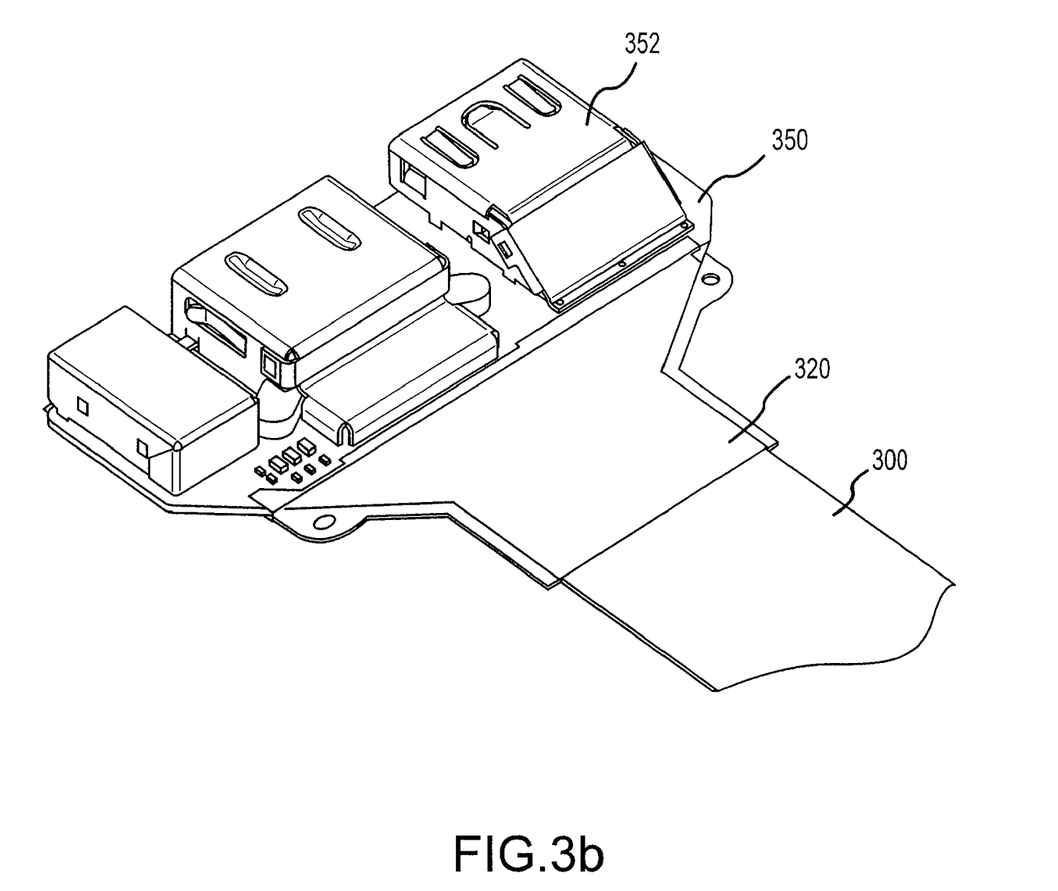
FIG. 3b depicts a perspective view of one embodiment of the flex cable and connectors removed from the I/O port housing.

A second Faraday cage may be electrically connected to the main Faraday cage formed by the case 308, top and bottom gaskets 316, 318 and conductive sock 320. Each individual I/O connector shell 350 (as shown in FIGS. 3A and 3B) may be considered a Faraday cage for the I/O connector contained therein. Typically, each such shell 350 is connected to a ground plane of the conductive sock 320. The sock generally extends to and may underlie the printed circuit board to which the I/O connector shell 350 is mounted. In this manner, the ground potential of the main Faraday cage matches that of each individual I/O connector shell.

Figure 1:
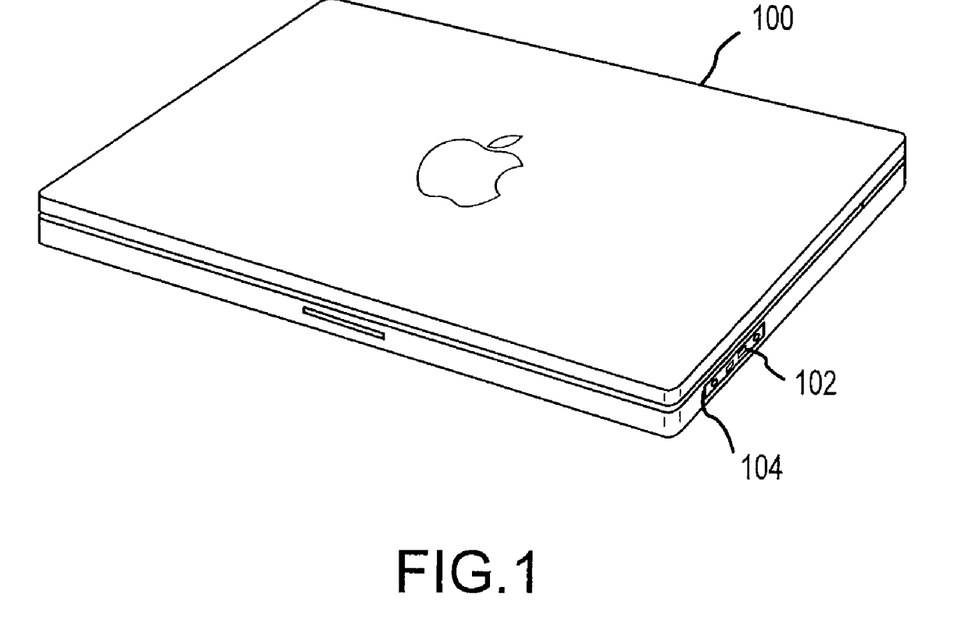
FIG. 1 depicts an exemplary computing device.

FIG. 1 shows an exemplary computing device, in this case a notebook or laptop computer 100. The notebook computer 100 includes one or more I/O ports 102 which facilitate communication between the computer 100 (or its constituent elements) and a peripheral, as generally previously described. The I/O ports 102 are held within an I/O housing 104. As shown in FIG. 1, the I/O housing 104 of the computer 100 occupies a fixed position; therefore, the I/O ports 102 are likewise fixed. The ports are thus constantly accessible to a user or device outside the computer itself.

It should be noted that the computer 100 shown in FIG. 1 is depicted as a notebook computer purely for convenience. The computer could be any form of computing device having one or more I/O ports, such as a desktop computer, mainframe, miniframe, network server, handheld computing device, personal digital assistant, mobile telephone, music or audio player (such as an MP3 player), and so on. Accordingly, a "computer," as used generally herein, encompasses all such devices and any other computing device having an I/O port.

Figure 2:
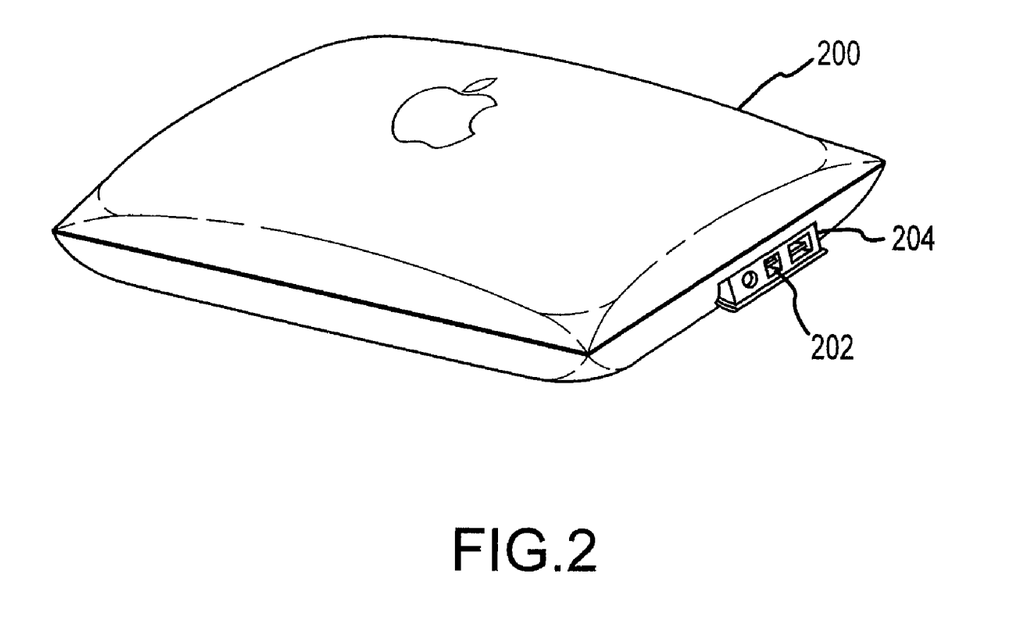
FIG. 2 depicts a first embodiment of the present invention, specifically a notebook computer.

FIG. 2 depicts a first embodiment of the present invention, specifically a notebook computer 200. As with the computer 100 of FIG. 1, the embodiment 200 includes one or more I/O ports 202 within an I/O housing 204. In this embodiment, however, the housing 204 may pivot between an open and closed position. In the open position, as shown in FIG. 2, the I/O ports 202 are exposed and can be accessed from outside the embodiment 200. When the housing is in a closed position, the I/O ports are covered and cannot be externally accessed.

FIG. 3a depicts a cross-sectional view of one embodiment of the present invention. The embodiment is shown with the I/O port housing 302 in the closed position. While this embodiment permits the I/O port housing 302 to transition between an open and a closed position, it should be appreciated that other embodiments may employ a static or fixed I/O port housing. In such an embodiment, the I/O port housing 302 may mount directly to the computer body 308 and may be continuously externally exposed, thereby providing constant external access to the I/O connectors 310.

It should also be noted that the flex cable 300 described herein with respect to one embodiment of the present invention is flexible, at least a portion of the cable may bend as the I/O port housing 302 is opened or closed. However, it should be appreciated that other embodiments may use a flex cable that is more rigid in its construction.

When the I/O port housing 302 is in the closed position shown in FIG. 3a, the I/O connectors 310 are typically located within the computer body 308 in notch 312. As described in more detail with respect to FIG. 4, a hinge 322 may be located at the bottom of the I/O port housing 302. The I/O port housing 302 may pivot about the hinge 322 to provide external access to the I/O connectors 310. As described below, the embodiment typically includes a Faraday cage formed about the flex cable 300 even when the I/O port housing 302 transitions between the closed and open positions. In one embodiment, one edge of the Faraday cage is located away from the I/O connectors 310 to allow at least a portion of the flex cable 300 to move as the I/O port housing 302 is rotated about the hinge 322.

The I/O connectors 310 of the embodiment may be any device capable of receiving electrical signals from a cable. Exemplary I/O connectors include FireWire, Universal Serial Bus (USB), Video Graphics Array (VGA), DB25, S-Video, Bayonet Neill-Concelman (BNC)-type connectors and so on. The construction of the connector 310 is known to those of ordinary skill in the art. As such, the operation and construction of the connector 310 will not be described further.

Referring to FIG. 3b, the I/O connectors 310 may be mated to a rigid section 350 of the flex cable 300 near the end of the cable. (The rigid section 350 may be, for example, a printed circuit board to which the I/O connectors 310 are mounted and which, in turn is electrically connected to the flex cable 300 at least via the sock 320.) An I/O connector shell 352 may also be mated to the rigid section 350, enshrouding the I/O connector 310 within the I/O connector shell 352. The I/O connector shell 352 may be mated to the rigid section 350 so as to provide an electrical contact between the shell 352 and the rigid section 350.

The flex cable 300 may extend from the rigid section 350, through the I/O port housing 302 and into the computer body 308. In one embodiment, the flex cable 300 provides electrical signals between the computer system and the I/O connectors 310. This allows the computer to interface with components located outside the computer body 308. The external components may use cables to connect to the I/O connectors 310 and provide communication between the computer and the external components.

Referring back to FIG. 3a, gaskets 316, 318 may be located above and below the flex cable 300, respectively, at the junction of the I/O port housing 302 and the computer body 308 (e.g. proximate to or near the hinge 322). The gaskets 316, 318 may be any device capable of maintaining contact between the gasket and the flex cable 300 as the I/O port housing 302 opens and closes. In this embodiment, the gaskets 316, 318 may be made from a flexible rubber material with a cover of a conductive material, such as a metal mesh. However, it should be appreciated that the gaskets 316, 318 can be made from any conductive material that provides a constant connection with the flex cable 300. For example, the gaskets may be formed from conductive material and biased against the flex cable 300 by a spring. In another example, the gaskets may be constructed from a conductive foam. Those skilled in the art can appreciate the many varied ways that the gaskets may be constructed, all of which are within the scope of this document.

As mentioned above, the gaskets 316, 318 of the present embodiment may be constructed from a flexible and hollow rubber tube. Surrounding the piece of rubber may be a flexible wire mesh of conductive material. The combination of the flexible rubber tube and wire mesh forms a flexible gasket 316, 318 capable of conducting electricity. The gaskets 316, 318 may be directly or otherwise operably connected to the computer body 308 directly above and below the flex cable 300. The gaskets 316, 318 may be mounted adjacent the I/O port housing 302 such that the gaskets 316, 318 run the width (but not the length) of the flex cable 300.

Referring to FIGS. 3a and 3b, a conductive sock 320 may surround the flex cable 300 along the portion of the flex cable 300 generally sandwiched by the gaskets 316, 318. The conductive sock 320 may be constructed of any suitable conductive material, such as a copper or other metal foil, and may be electrically connected to the ground plane(s) of the flex cable 300. Thus, the ground plane of the cable electrically connects to the gaskets 316, 318 through the conductive sock 320 surrounding the flex cable. As explained below, this configuration may form a portion of the Faraday cage surrounding the flex cable 300.

Referring to FIG. 3b, a second Faraday cage may be formed fully or partially by the I/O connector shell 352. As described, the I/O connector shell 352 may be electrically connected to the rigid section 350 of the flex cable 300 (e.g., the printed circuit board on which the shell is mounted). Thus, the ground of the Faraday cage of the connector 310 may be electrically matched from the connector to the edge of the rigid section 350. Further, by electronically connecting the rigid section 350 to the conductive sock 320, the smaller Faraday cage of the connector 310 can be connected to the larger Faraday cage defined above for FIG. 3a. In addition, electrically tying the two Faraday cages together prevents any portion of the cable 400 or I/O connectors from being exposed outside a Faraday cage, thus preventing noise from entering or exiting the interior of the computer shell via the I/O system.

Figure 4:
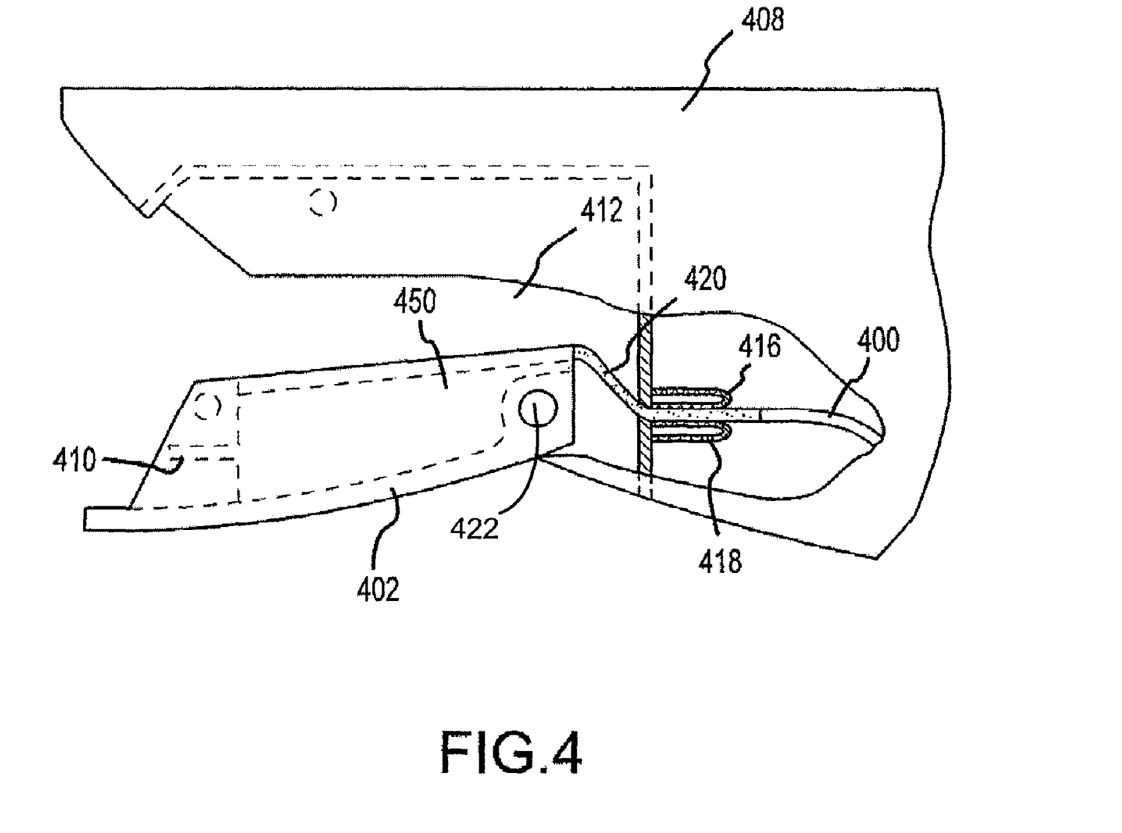
FIG. 4 depicts a cross-sectional view of one embodiment of the present invention with the I/O port housing in the open position.

FIG. 4 depicts a cross-sectional view of one embodiment of the present invention, showing the I/O port housing 402 in the open position. As described above, a hinge 422 may be located at the bottom of the I/O port housing 402. To open, the I/O port housing 402 may pivot about the hinge 422 to remove the I/O connectors 410 from the notch 412 of the computer body 408 to provide external access to the I/O connectors 410. In this embodiment, the edge of the Faraday cage is located away from the I/O connectors 410 to allow the flex cable 400 to move between the gasket 416, 418 when the I/O port housing 402 is opened while maintaining a Faraday cage surrounding the cable 300.

It should be noted that one or both of the gaskets 416, 418 may be U-shaped, C-shaped or V-shaped in cross section instead or circular, elliptical or solid. For example, forming the top gasket 416 in A U- or V-shape may deflect force exerted on the gasket during opening or closing of the I/O port inward (or outward) with respect to the case, rather than up or down onto the flex cable 400. This, in turn, may reduce the chances of the cable 400 crimping or failing to translate as the I/O port moves.

Similar to FIG. 3a, this embodiment may provide I/O connectors 410 mated to a rigid section of the flex cable 400 near the end of the cable. An I/O connector shell may also be mated to the rigid section, enshrouding the I/O connector 410 within the I/O connector shell. The I/O connector shell may also be mated to the rigid section of the cable so as to provide an electrical contact between the shell and the rigid section.

The flex cable 300 may extend from the rigid section 350, through the I/O port housing 302 and into the computer body 308. In one embodiment, the flex cable 300 provides electrical signals between the computer system and the I/O connectors 310. This allows the computer to interface with components located outside the computer body 308. The external components may use cables to connect to the I/O connectors 310 and provide communication between the computer and the external components.

Gaskets 416, 418 similar to those described in FIG. 3 may be located above and below the flex cable 400, respectively, at the junction of the I/O port housing 402 and the computer body 408 (e.g. near the hinge 422). The gaskets 416, 418 of this embodiment may be constructed from a flexible, hollow rubber tube. Surrounding the piece of rubber may be a flexible wire mesh of conductive material. The combination of the flexible rubber tube and wire mesh forms a flexible gasket 416, 418 capable of conducting electricity. The gaskets 416, 418 may be directly or otherwise operably connected to the computer body 408 directly above and below the flex cable 400.

Referring to FIGS. 3a and 4, a conductive sock 420 may surround the flex cable 400 along the portion of the flex cable generally sandwiched by the gaskets 416, 418. The conductive sock 420 may be constructed of any suitable conductive material, such as metal foil, and may be electrically connected to the ground plane of the flex cable 400. Thus, the ground plane electrically connects to the gaskets 416, 418 through the conductive sock 420 surrounding the flex cable. As explained above, this configuration may form a portion of the Faraday cage surrounding the flex cable 400.

The sock 420 may be electrically connected to an exposed portion of the flex cable 400 underlying the sock. That is, a portion of the flex cable's copper ground layer may be electrically connected to the sock. This not only maintains the same ground potential for the sock and flex cable, but also ultimately electrically connects each I/O connector shell 350 to the flex cable ground. In this manner, the connector shells need not be directly connected to any I/O cable. This, in turn, permits the I/O port housing 402 to open and close without interference from mechanical aspects of the connector shells 350 that would otherwise be required to properly ground the connector shells.

In addition, it should be noted that certain connector shells, such as those for DVI and USB I/O connectors, may be structured in a different manner from typical connector shells in order to take advantage of particular features of the flex cable 400 and/or printed circuit board 350. For example, such connector shells may include a number of connector pins extending through the cable or board. A secondary shield may be installed on the underside of the board/cable to electrically shield the pins from external noise and prevent signals carried on those pins from radiating as electrical noise. This shield may be installed after the connection of the pins is verified during manufacture.

The Faraday cage created by the embodiment of FIG. 4 is described above for FIG. 3. As described, the Faraday cage of the present embodiment may be partially composed of the computer body 408, including the top, bottom, and sides of the case. The Faraday cage may be completed by the top, bottom, and sides of the I/O port housing 402 combined with the top gasket 416, the conductive sock 420, and the bottom gasket 418. In essence, the Faraday cage of the present embodiment may remain the same whether the I/O port housing is in the open or closed position.

Further, as the I/O port housing 402 pivots into the open position, the gasket 418 below the cable 400 may be pinched against the flex cable 400 providing a better electrical connection between the gasket 418 and the conductive sock 420. Similarly, the gasket 416 above the cable 400 may be pinched against the cable 400 when the I/O port housing 402 is closed, providing a better electrical connection between the gasket 416 above the cable 400 and the conductive sock 420. However, it should be appreciated that it is not necessary for the present invention for either the gasket 418 below the cable 400 or the gasket 416 above the cable to pinch the cable 400 as the I/O port housing 402 is opened and closed. The gaskets 416,418 complete the Faraday cage as long as they maintain contact with the conductive sock 420 of the flex cable 400.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustration only and are not intended to limit the scope of the present invention. References to details of particular embodiments are not intended to limit the scope of the invention.

The invention claimed is:

1. An apparatus for electrically shielding an interior element, comprising:
   a chassis defining a notch;
   a first gasket electrically coupled to a first portion of the notch;
   a second gasket electrically coupled to a second portion of the notch;
   a conductive sock placed between the first gasket and the second gasket and electrically coupled to both the first gasket and the second gasket; and
   a connector shell electrically coupled to the conductive sock;

wherein the chassis, the first gasket, the second gasket, the conductive sock and the connector shell collectively prevent at least some noise from entering or exiting an interior of the chassis.

2. The apparatus of claim 1, further comprising:
a cable passing through the conductive sock between the first gasket and the second gasket.

3. The apparatus of claim 2, wherein the conductive sock is electrically coupled to the ground plane of the cable.

4. The apparatus of claim 1, wherein the first gasket and the second gasket are comprised of a flexible conductive material.

5. The apparatus of claim 4, wherein the flexible conductive material comprises:
a first layer of a rubber or flexible polymer; and
a second metal layer bonded thereto.

6. The apparatus of claim 1, wherein the conductive sock is comprised of a metal foil.

7. An apparatus for electrically shielding an interior element of a computer, comprising:
a computer body defining a notch;
a first gasket electrically coupled to a first portion of the notch;
a second gasket electrically coupled to a second portion of the notch and to the first gasket;
a conductive sock placed between the first gasket and the second gasket and electrically coupled to both the first gasket and the second gasket; and
a connector shell electrically coupled to the conductive sock;
wherein the computer body, the first gasket, the second gasket, the conductive sock and the connector shell collectively prevent at least some noise from entering an interior of the computer body.

8. The apparatus of claim 7, wherein the computer body, the first gasket, the second gasket, the conductive sock and the connector shell further collectively prevent at least some noise from exiting an interior of the computer body.

9. The apparatus of claim 8, wherein the computer body, the first gasket, the second gasket the conductive sock and the conductive sock collectively define a first Faraday cage.

10. The apparatus of claim 8, wherein the notch defines an I/O port for the computer.

11. The apparatus of claim 10, further comprising:
a cable passing through the conductive sock and electrically coupled to the I/O port; wherein
the conductive sock is located between the first gasket and the second gasket.

12. The apparatus of claim 11, wherein the conductive sock is electrically coupled to the ground plane of the cable.

13. The apparatus of claim 7, wherein the conductive sock is comprised of a metal foil.

14. A method for electrically shielding an interior element of an electronic system, comprising:
providing a chassis defining a notch;
electrically coupling a first gasket to a first portion of the notch;
electrically coupling a second gasket to a second portion of the notch;
placing a conductive sock between the first gasket and the second gasket;
electrically coupling the conductive sock to both the first gasket and the second gasket; and
coupling a connector shell to the conductive sock via at least one connector;
wherein the chassis, the first gasket, the second gasket the conductive sock and the connector shell collectively prevent at least some noise from exiting an interior of the chassis.

15. The method of claim 14, further comprising:
passing a cable through the conductive sock between the first gasket and the second gasket.

16. The method of claim 14, further comprising:
electrically coupling the conductive sock to the ground plane of the cable.

17. The method of claim 16, further comprising:
placing a shield over a portion of the at least one connector.

18. The method of claim 17, wherein the connector shell houses a digital video interface connector.

* * * * *